(12) United States Patent
Takeuchi et al.

(10) Patent No.: US 12,453,289 B2
(45) Date of Patent: Oct. 21, 2025

(54) PIEZOELECTRIC ACTUATOR

(71) Applicant: KYOCERA Corporation, Kyoto (JP)

(72) Inventors: Satoshi Takeuchi, Kawasaki (JP); Kazuki Tanaka, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 806 days.

(21) Appl. No.: 17/783,491

(22) PCT Filed: Dec. 4, 2020

(86) PCT No.: PCT/JP2020/045207
§ 371 (c)(1),
(2) Date: Jun. 8, 2022

(87) PCT Pub. No.: WO2021/117626
PCT Pub. Date: Jun. 17, 2021

(65) Prior Publication Data
US 2023/0010598 A1  Jan. 12, 2023

(30) Foreign Application Priority Data

Dec. 11, 2019  (JP) ................. 2019-223798

(51) Int. Cl.
*H10N 30/88* (2023.01)
*H10N 30/50* (2023.01)
*H10N 30/80* (2023.01)

(52) U.S. Cl.
CPC .......... *H10N 30/883* (2023.02); *H10N 30/50* (2023.02); *H10N 30/80* (2023.02); *H10N 30/88* (2023.02)

(58) Field of Classification Search
CPC ...... H10N 30/883; H10N 30/80; H10N 30/50; H10N 30/88
See application file for complete search history.

(56) References Cited

U.S. PATENT DOCUMENTS

| 5,334,902 A * | 8/1994 | Inoi ................. H10N 30/88 310/344 |
| 5,365,140 A | 11/1994 | Ohya et al. |
| 6,781,285 B1 * | 8/2004 | Lazarus ........... H10N 30/2041 310/332 |
| 7,898,152 B2 * | 3/2011 | Stocker ............ H10N 30/886 310/328 |
| 8,240,014 B2 * | 8/2012 | Gibson ............. F02M 63/0026 29/25.35 |

(Continued)

FOREIGN PATENT DOCUMENTS

| JP | 63-066980 A | 3/1988 |
| JP | 63-283180 A | 11/1988 |

(Continued)

*Primary Examiner* — Emily P Pham
(74) *Attorney, Agent, or Firm* — Volpe Koenig

(57) ABSTRACT

A piezoelectric actuator includes a piezoelectric element having a longitudinal direction, a case including a lid portion, a bottom portion, and a tubular portion and housing the piezoelectric element inside, and a strain gauge positioned at the tubular portion. The tubular portion includes a plurality of bent portions in the longitudinal direction, each of the plurality of bent portions bending in response to extension and contraction of the piezoelectric element. The strain gauge is positioned at the bent portion.

9 Claims, 10 Drawing Sheets

(56) References Cited

U.S. PATENT DOCUMENTS

| | | | | |
|---|---|---|---|---|
| 9,130,149 B2* | 9/2015 | Setoguchi | ............ | B23K 33/00 |
| 2009/0189485 A1* | 7/2009 | Iyoki | ................ | H10N 30/2027 |
| | | | | 310/317 |
| 2013/0283922 A1 | 10/2013 | Qualtieri et al. | | |

FOREIGN PATENT DOCUMENTS

| | | |
|---|---|---|
| JP | 6-188471 A | 7/1994 |
| JP | 2018-007360 A | 1/2018 |
| WO | 2019/159959 A1 | 8/2019 |

\* cited by examiner

PIEZOELECTRIC ACTUATOR

CROSS-REFERENCE TO RELATED APPLICATION(S)

This application is a national stage application of International Application No. PCT/JP2020/045207, filed on Dec. 4, 2020, which designates the United States, the entire contents of which are herein incorporated by reference, and which is based upon and claims the benefit of priority to Japanese Patent Application No. 2019-223798, filed on Dec. 11, 2019, the entire contents of which are herein incorporated by reference.

TECHNICAL FIELD

The present disclosure relates to a piezoelectric actuator.

BACKGROUND ART

As a piezoelectric actuator used for a mass flow controller, an XY table precision positioning device, and the like, for example, a multi-layered piezoelectric body disclosed in JP 63-66980 A (hereinafter referred to as Patent Document 1) is known. The multi-layered piezoelectric body includes a piezoelectric element and a case that houses the piezoelectric element inside. In the multi-layered piezoelectric body, a strain gauge is adhered to the surface of the case to detect a displacement of the multi-layered piezoelectric body.

SUMMARY OF INVENTION

A piezoelectric actuator of the present disclosure includes a piezoelectric element having a longitudinal direction, a case including a lid portion, a bottom portion, and a tubular portion, the case housing the piezoelectric element inside, and a strain gauge positioned at the tubular portion. The tubular portion includes a plurality of bent portions in the longitudinal direction, the bent portion bending in response to extension and contraction of the piezoelectric element, and the strain gauge is positioned at the bent portion.

DESCRIPTION OF EMBODIMENTS

Embodiments of a piezoelectric actuator according to the present disclosure will be described below with reference to the drawings. Note that the present invention is not limited to the embodiments that will be described below.

Figure 1:
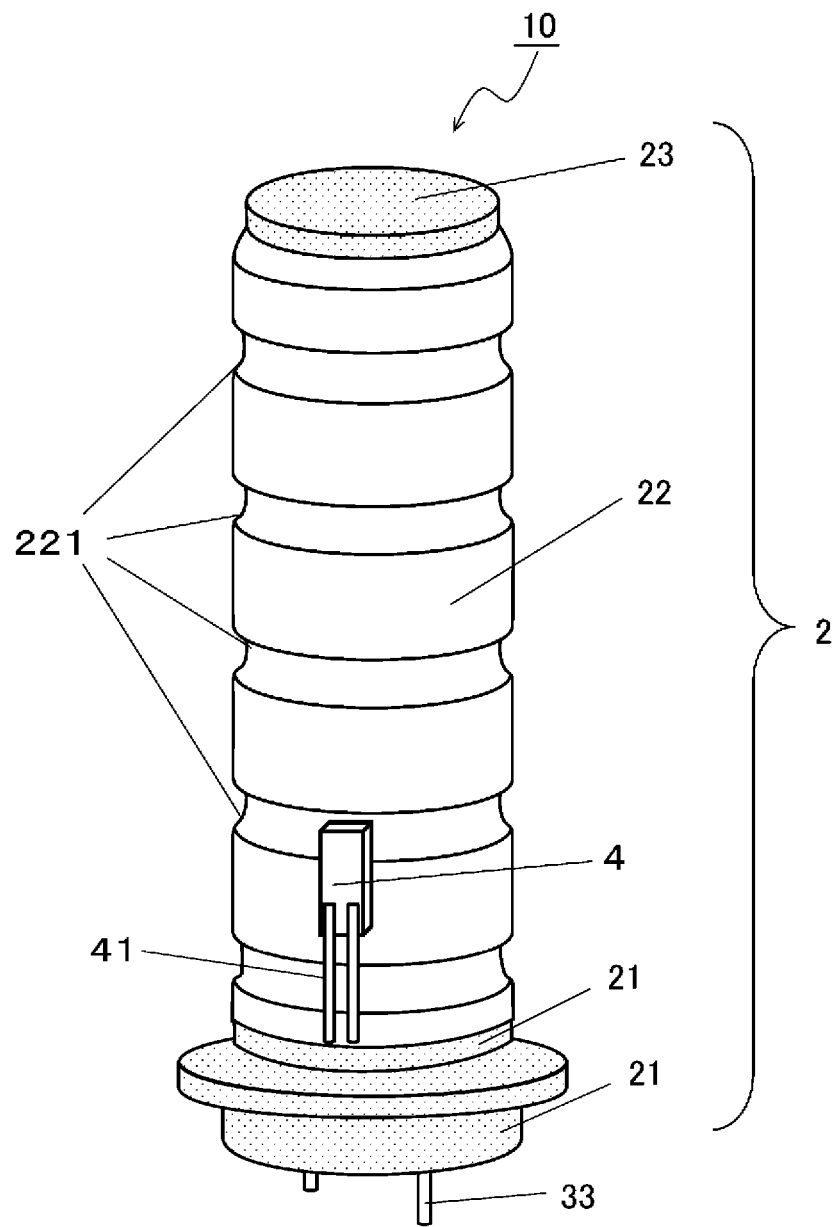
FIG. 1 is a schematic perspective view illustrating an example of a piezoelectric actuator.

A piezoelectric actuator 10 illustrated in FIG. 1 includes a piezoelectric element 1 and a case 2. The case 2 houses the piezoelectric element 1 inside and includes a bottom portion 21, a tubular portion 22, and a lid portion 23.

Figure 2:
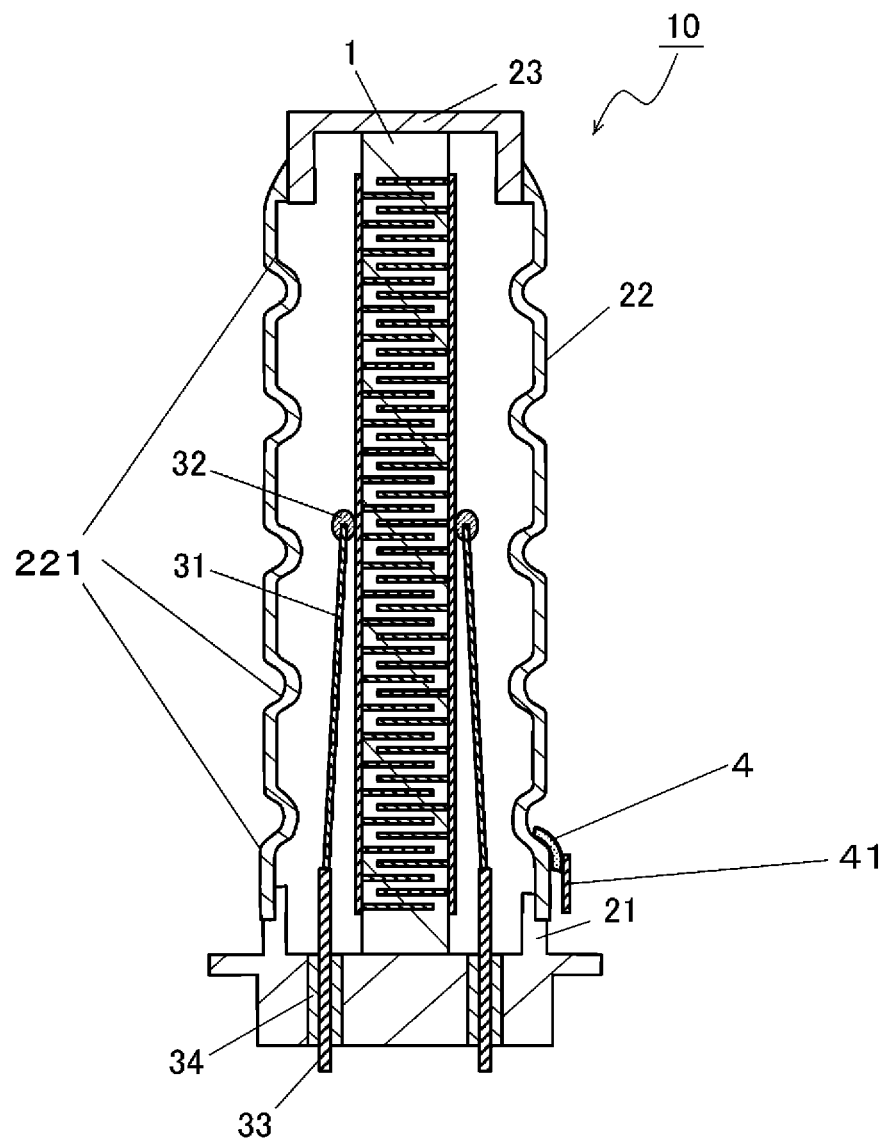
FIG. 2 is a schematic vertical cross-sectional view of the example of the piezoelectric actuator illustrated in FIG. 1.

As illustrated in FIG. 2, the piezoelectric element 1 forming the piezoelectric actuator 10 is a piezoelectric element provided with a layered body including, for example, an active portion in which a plurality of piezoelectric layers and internal electrode layers are alternately layered, and an inactive portion including the piezoelectric layers layered at both ends in a layering direction of the active portion. Here, the active portion is a portion where the piezoelectric layers extend or contract in the layering direction during driving, and the inactive portion is a portion where the piezoelectric layers do not extend or contract in the layering direction during driving.

The layered body forming the piezoelectric element 1 is formed in a rectangular parallelepiped shape, for example, having a length of approximately 4 mm to 7 mm, a width of approximately 4 mm to 7 mm, and a height of approximately 20 mm to 50 mm. The layered body may also have, for example, a hexagonal column shape or an octagonal column shape.

The piezoelectric layers forming the layered body include piezoelectric ceramic having piezoelectric characteristics, and the piezoelectric ceramic has an average particle size of, for example, 1.6 μm to 2.8 μm. Examples of the piezoelectric ceramic that can be used include perovskite-type oxides made from lead zirconate titanate ($PbZrO_3$—$PbTiO_3$), lithium niobate ($LiNbO_3$), lithium tantalate ($LiTaO_3$), and the like.

Further, the internal electrode layers forming the layered body mainly contains, for example, a metal such as silver, silver-palladium, silver-platinum, or copper. For example, positive electrodes and negative electrodes are alternately disposed in the layering direction. The positive electrodes are drawn out to one side surface of the layered body, and the negative electrodes are drawn out to another side surface thereof. With this configuration, in the active portion, a drive voltage can be applied to the piezoelectric layer sandwiched between the internal electrode layers adjacent to each other in the layering direction.

Note that the layered body may include a metal layer or the like that is a layer for mitigating stress and does not function as the internal electrode layer.

Then, external electrodes are provided on each of a pair of opposing side surfaces of the layered body from which the positive electrodes or the negative electrodes (or ground electrodes) of the internal electrode layers are drawn out, and the external electrodes are electrically connected to the drawn-out internal electrode layers. The external electrode is a metallization layer containing, for example, silver and glass.

Both positive and negative electrodes (or ground electrodes) of the internal electrode layers are exposed on another pair of opposing side surfaces of the layered body, and these side surfaces are provided with a covering layer including an insulator as necessary. By providing the covering layer, it is possible to prevent creeping discharge between the electrodes from occurring when a high voltage is applied during driving. Examples of the insulator that serves as the covering layer include a ceramic material, and in particular, a material that can be deformed by stress can be used so as to follow drive deformation (extension and contraction) of the layered body, which occurs when the piezoelectric actuator 10 is driven, the material being deformable by stress so as to eliminate a possibility that the creeping discharge occurring as a result of the covering layer peeling off. Specifically, examples of the material include a ceramic material such as partially stabilized zirconia that can deform through local phase transformation and volume change when stress is generated, and $Ln_{1-x}Si_xAlO_{3+0.5x}$ (Ln represents at least one selected from the group consisting of Sn, Y, La, Ce. Pr, Nd, Pm, Sm, Eu, Gd, Tb, Dy, Ho, Er, Tm and Yb. x=0.01 to 0.3), and a piezoelectric material such as barium titanate and lead zirconate titanate in which the interionic distance inside the crystal lattice changes so as to mitigate the generated stress. Such covering layer is formed, for example, into an ink form, then applied to the side surfaces of the layered body by dipping or screen printing, and sintered.

The case 2 forming the piezoelectric actuator 10 includes the bottom portion 21, the tubular portion 22, and the lid portion 23. Then, the case 2 houses the piezoelectric element 1 inside, the lower end surface of the piezoelectric element 1 is in contact with the upper surface of the bottom portion 21, and the upper end surface of the piezoelectric element 1 is in contact with the lower surface of the lid portion 23.

The bottom portion 21, the tubular portion 22, and the lid portion 23 may be, for example, metal bodies such as SUS304 and SUS316L. Further, the bottom portion 21, the tubular portion 22, and the lid portion 23 may be integrally formed, or may be formed by separate bodies being bonded to each other using a known technique such as welding or adhering, for example.

The tubular portion 22 is a tubular body extending vertically and having openings at both ends. The tubular portion 22 includes a bent portion 221 that bends due to the extension and contraction of the piezoelectric element 1. Due to the expansion and contraction of the piezoelectric element 1, the bent portion 221 bends so as to extend in the longitudinal direction to extend and contract the case 2 as a whole. The bent portion 221 is formed, for example, by forming a seamless tube having a predetermined shape and then forming the seamless pipe into a bellows shape by rolling or hydrostatic pressing. The tubular portion 22 has a predetermined spring constant such that the extension and contraction of the piezoelectric element 1 can be followed when a voltage is applied to the piezoelectric element 1, and the spring constant is adjusted according to the thickness, the shape of grooves, and the number of grooves. For example, the thickness of the tubular portion 22 is from 0.1 to 0.5 mm. Note that the tubular portion 22 may include a straight portion in addition to the bent portion 221. Further, a plurality of the bent portions 221 are provided in the longitudinal direction. In this way, when the case 2 extends and contracts, stress generated at the bent portion 221 can be dispersed. This makes it possible to reduce the possibility that the bent portion 221 is damaged as a result of the stress being concentrated therein.

The lid portion 23 is formed such that the outer diameter is approximately the same as the inner diameter of the opening on one end side of the tubular portion 22. The lid portion 23 is fitted through the opening on the one end side of the tubular portion 22, and the side surface (outer periphery) of the lid portion 23 is bonded to the inner wall of the tubular portion 22 in the vicinity of the opening on the one end side by welding, for example. At this time, a bonded portion between the tubular portion 22 and the lid portion 23 is referred to as a welded portion.

The bottom portion 21 includes, for example, a bottom plate portion and an annular protruding portion vertically provided at the bottom plate portion. The bottom plate portion has a circular plate shape, and in the example illustrated in the drawings, a peripheral edge portion thereof is thinner than other portions thereof. Note that two through holes through which lead pins 33 can be inserted are formed in the bottom portion 21, and the lead pins 33 are inserted through the through holes. Then, a gap in the through hole is filled with, for example, soft glass 34, whereby the lead pin 33 is fixed. A lead wire 31 is connected to the tip of the lead pin 33, and this lead wire 31 is attached to the external electrode of the piezoelectric element 1 by solder 32 to apply a drive voltage to the piezoelectric element 1 through the lead wire 31.

The strain gauge 4 is a member that detects a displacement of the case 2. The strain gauge 4 is, for example, a plate-shaped member having a metal wire inside. The strain gauge 4 has a shape having a longitudinal direction and having a length of 0.1 mm to 50 mm and a width of from 2 mm to 120 mm, for example. The strain gauge 4 may be a disc-shaped member having a diameter of 2 to 8 mm, for example. The strain gauge 4 is adhered to the case 2 to be measured by a resin adhesive material, for example. In accordance with the extension and contraction of the case 2, the metal wire provided inside the strain gauge 4 extends and contracts, and as a result, a resistance value of the metal wire changes. By measuring the change in the resistance, a strain of the case 2 can be measured. The strain gauge 4 is adhered to the tubular portion 22 of the case 2.

As illustrated in FIG. 1, according to the piezoelectric actuator 10 of the present disclosure, the strain gauge 4 is positioned at the bent portion 221. Since the tubular portion 221 includes the bent portion 221 at which the tubular portion 221 is bent, an adhesive can be easily accumulated in the bent portion 221. Thus, the adhesion strength between the strain gauge 4 and the case 2 can be increased. As a result, the possibility that the strain gauge 4 comes off from the case 2 can be reduced.

Further, as illustrated in FIG. 2, the strain gauge 4 may be positioned outside the case 2. When the strain gauge 4 is provided inside the case 2, the adhesive adhering the strain gauge 4 to the case 2 may react with oxygen to generate moisture that causes a short circuit of the piezoelectric element 1. However, when the strain gauge 4 is positioned outside the case 2, the possibility of generating the moisture that causes the short circuit can be reduced. As a result, durability of the piezoelectric element 1 can be increased.

Note that the strain gauge 4 need not necessarily be entirely provided at the bent portion 221, and as illustrated in FIG. 2, the strain gauge 4 may be provided from the bent portion 221 to the straight portion.

Figure 3:
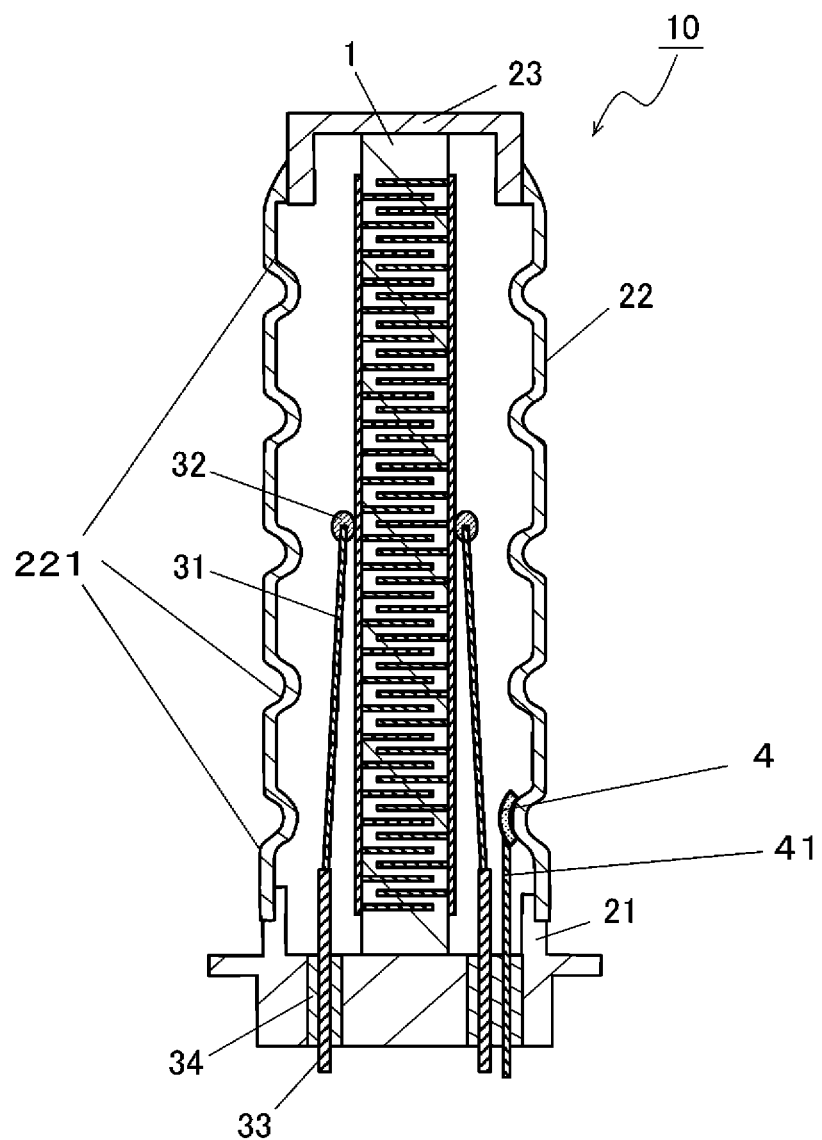
FIG. 3 is a schematic vertical cross-sectional view of another example of the piezoelectric actuator.

Further, as illustrated in FIG. 3, the strain gauge 4 may be positioned inside the case 2. When the strain gauge 4 is positioned outside the case 2, depending on the external environment, the adhesive of the strain gauge 4 may be oxidized, which may reduce the adhesiveness. However, when the strain gauge 4 is positioned inside the case 2, and an influence of the external environment can be reduced. This makes it possible to suppress a decrease in adhesiveness.

When the strain gauge 4 is positioned inside the case 2, the lead wire 41 may be inserted through the through hole, through which the lead pin 33 is inserted, of the bottom portion 21. In this case, even if the number of strain gauges 4 is increased, the number of through holes in the bottom portion 21 is not required to be increased, and thus, the strain gauge 4 can be energized without reducing the strength of the bottom portion 21.

Figure 4:
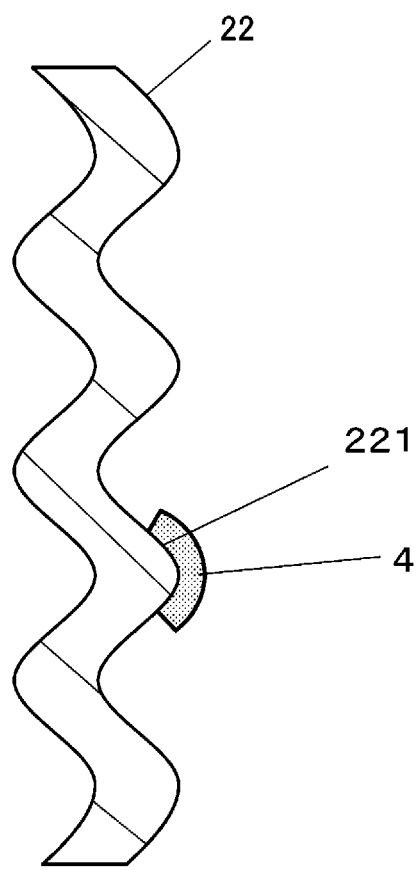
FIG. 4 is an enlarged cross-sectional view of a main portion of another example of the piezoelectric actuator.

Further, as illustrated in FIG. 4, the tubular portion 22 has the bellows shape, and the strain gauge 4 may be positioned at a bellows-shaped portion of the tubular portion 22. Here, the bellows shape is a shape in which a plurality of protruding portions or recessed portions are repeatedly formed, but may include a straight portion. Further, the bellows shape may be a shape in which a plurality of grooves are provided in the circumferential direction. As a result of the tubular portion 22 having the bellows shape, stress generated at the bent portion 221 can be dispersed. Thus, when the piezoelectric actuator 10 is driven, the stress applied to the bent portion 221 can be reduced. As a result, durability of the piezoelectric actuator 10 can be increased.

In particular, in recent years, the piezoelectric actuator 10 has been required to be used in a high temperature environment. Thus, during long-term use, there is a possibility that an extension and contraction behavior of the bellow-shaped portion may be locally changed due to metal fatigue. As a result of the strain gauge 4 being positioned at the bellows-shaped portion, the local change in the extension and contraction behavior can be detected. As a result, the durability of the piezoelectric actuator 10 can be increased.

Further, as illustrated in FIG. 4, the strain gauge 4 may be positioned at the protruding surface of the bent portion 221. The curvature of the strain gauge 4 increases as the case 2 extends, and decreases as the case 2 contracts. That is, the strain gauge 4 itself bends in response to the extension and contraction of the case 2. Thus, the local stress of the protruding portion can be measured.

Note that in FIGS. 4 to 8, for ease of understanding, the strain gauge 4 and the tubular portion 22 are partially illustrated, and other members such as the lead wire 41 and the adhesive are omitted.

Figure 5:
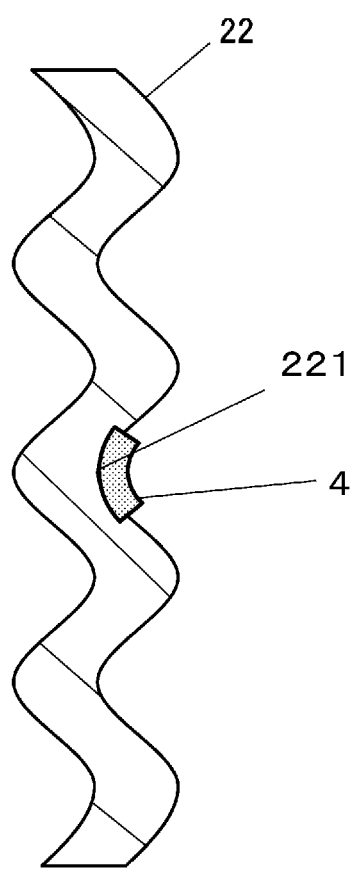
FIG. 5 is an enlarged cross-sectional view of the main portion of another example of the piezoelectric actuator.

Further, as illustrated in FIG. 5, the strain gauge 4 may be positioned at the recessed surface of the bent portion 221. In this case, compared to the case in which the bent portion 221 is positioned at the protruding surface of the bent portion 221, the outer diameter or the inner diameter of the case 2 can be reduced. Thus, the size of the piezoelectric actuator 10 can be reduced. In particular, when the strain gauge 4 is positioned inside the case 2, as a result of the strain gauge 4 being positioned at the recessed surface of the bent portion 221, a possibility of the piezoelectric element 1 coming into contact with the strain gauge 4 and being short circuited can be reduced.

Furthermore, since the strain gauge 4 is sandwiched between the protruding surfaces of the case 2, the strain gauge 4 is less likely to come off from the case 2. In addition, when the case 2 is compressed by stress from the outside to an extreme extent, as a result of the strain gauge 4 being sandwiched between the protruding surfaces to detect the strain, such that the case 2 is prevented, in advance, from being damaged. Further, the entire strain gauge 4 may be positioned to be closer to the recessed portion than to an apex of the protruding portion in a direction perpendicular to the longitudinal direction of the piezoelectric element 1.

Figure 6:
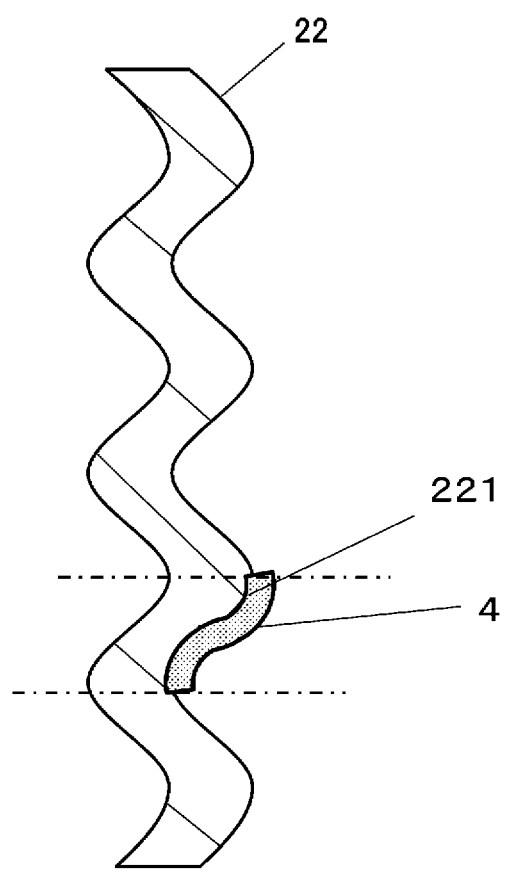
FIG. 6 is an enlarged cross-sectional view of the main portion of another example of the piezoelectric actuator.

Further, as illustrated in FIG. 6, the strain gauge 4 may be positioned from the protruding surface to the recessed surface of the bent portion 221. In this case, the strain gauge 4 can detect the displacement of half a cycle of the protrusion and recess of the bellows shape. Thus, by multiplying the detected numerical value of the displacement by twice the number of bellows, the displacement of the entire case 2 can be calculated. That is, since the displacement of the entire case 2 can be identified without increasing the adhesion area between the case 2 and the strain gauge 4, the stress between the case 2 and the strain gauge 4 is reduced, and the possibility that the strain gauge 4 comes off from the case 2 can be reduced.

Figure 7:
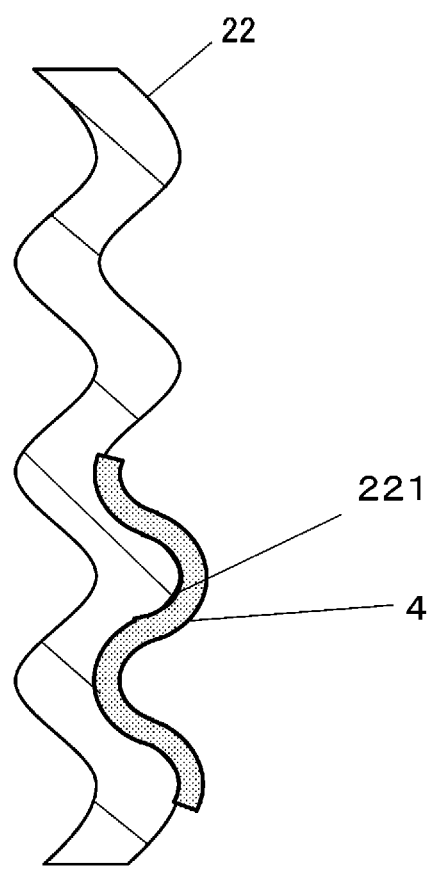
FIG. 7 is an enlarged cross-sectional view of the main portion of another example of the piezoelectric actuator.

Further, as illustrated in FIG. 7, the strain gauge 4 may be provided from the protruding portion to the protruding portion. As a result, the strain gauge 4 itself is formed into a spring shape, and can extend and contract in the same manner as the element. Thus, the strain gauge 4 can be prevented from coming off from the case. At the same time, since the strain gauge 4 is locally strained at three locations including the protruding portion, the recessed portion, and the protruding portion, the stress generated at a bonded portion between the strain gauge 4 and the case 2 can be dispersed. As a result, the strain gauge 4 is prevented from coming off from the case 2 can be reduced. In addition, since shearing stress generated at an inflection point between the protruding portion and the recessed portion can also be detected, detection sensitivity is improved.

Similarly, the strain gauge 4 may be provided from the recessed portion to the recessed portion. In this case also, the same effects as described above can be obtained.

Figure 8:
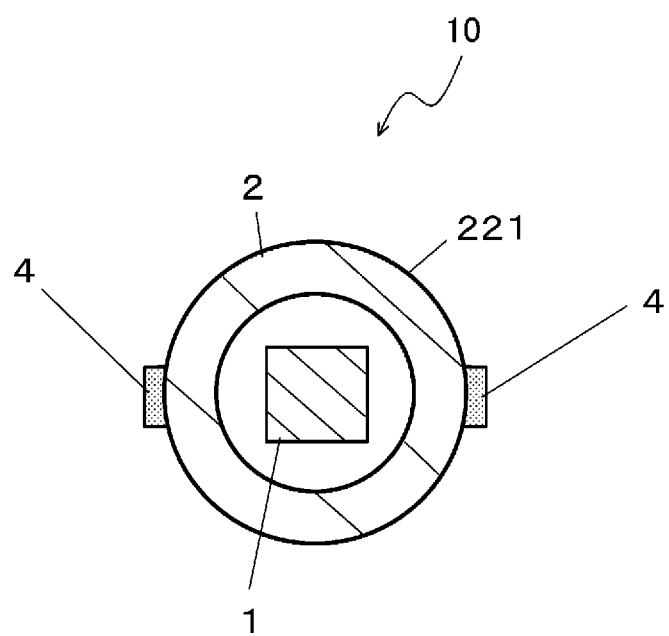
FIG. 8 is an enlarged cross-sectional view of another example of the piezoelectric actuator.

Further, as illustrated in FIG. 8, the strain gauges 4 may be positioned at symmetrical positions with respect to the piezoelectric element 1. Although the stress tends to be concentrated at a portion, of the bent portion 221, at which the strain gauge 4 is provided, even if the strain gauge 4 inhibits the deformation of the case 2, the displacement can be generated symmetrically with respect to the case 2 as a whole, and thus, the stress generated in the case 2 can be dispersed. As a result, durability of the piezoelectric actuator 10 can be increased.

Figure 9:
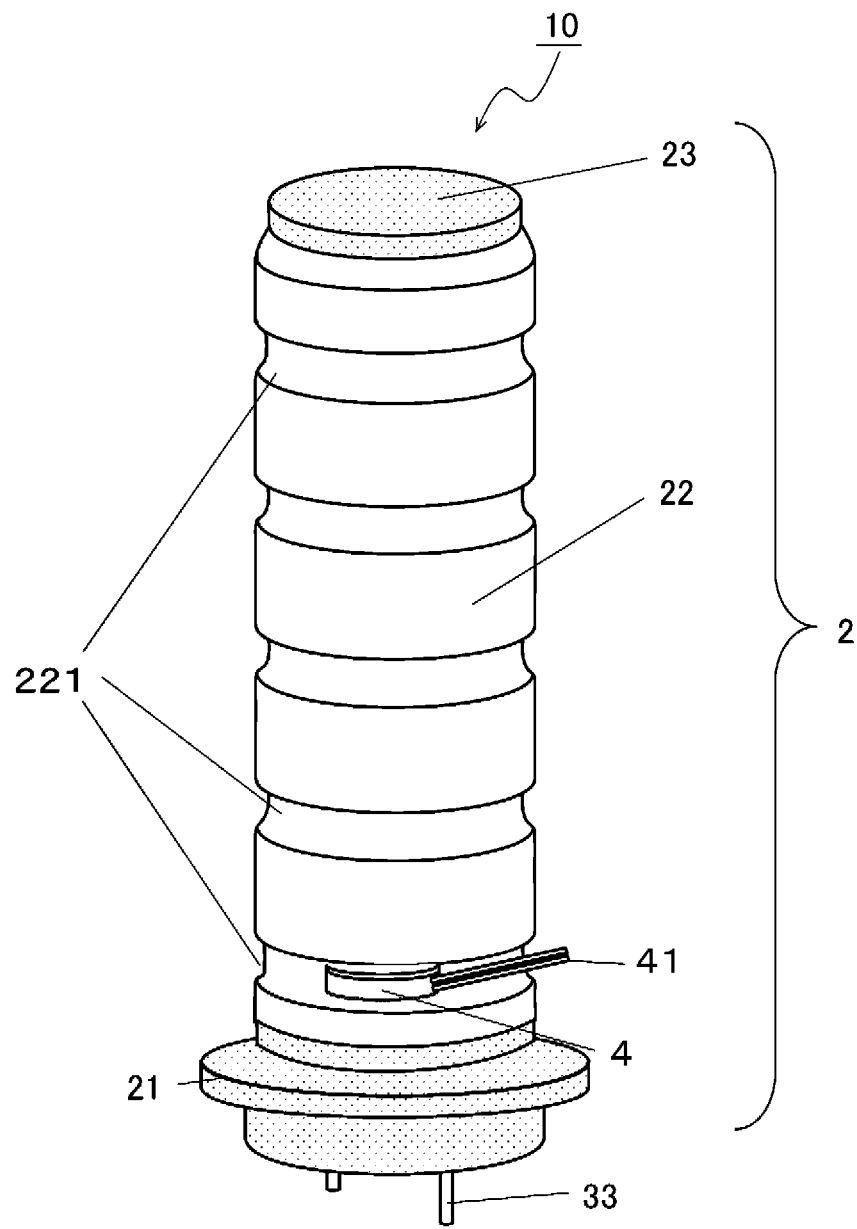
FIG. 9 is a schematic perspective view illustrating another example of the piezoelectric actuator.

Further, as illustrated in FIG. 9, the strain gauge 4 may be a plate-shaped member having a longitudinal direction, and the longitudinal direction may be positioned so as to overlap with the circumferential direction of the case 2. As a result, stress, in a twist direction, generated by the extension and contraction of the piezoelectric element 1 can be detected.

Further, the strain gauge 4 may also be provided in the vicinity of the welded portion. This makes it possible to detect a strain in the vicinity of the welded portion, which is not supposed to be deformed under normal circumstances. Specifically, as illustrated in FIG. 9, the strain gauge 4 may be positioned at a portion closest to the welded portion among the plurality of bent portions 221.

Further, by attaching a plurality of strain gauges 4, it is possible to detect local changes over time in the case 2 and suppress the damage of the piezoelectric actuator 10.

Figure 10:
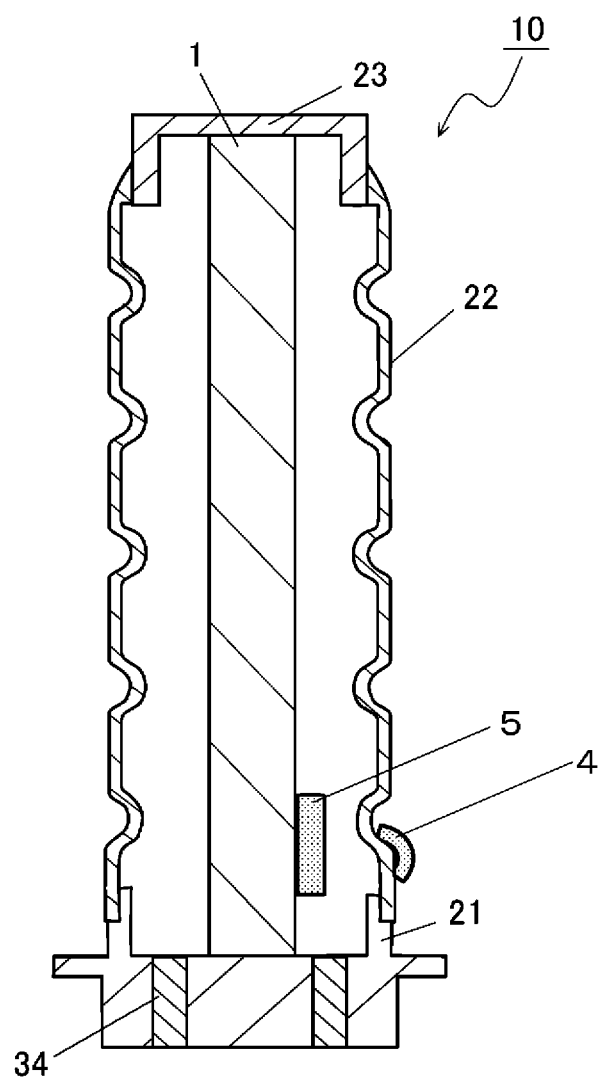
FIG. 10 is a schematic vertical cross-sectional view illustrating another example of the piezoelectric actuator.

Further, as illustrated in FIG. 10, the strain gauge 4 may be provided on the surface of the case 2, and a second strain gauge 5 may be provided at the side surface of the piezoelectric element 1. As a result, the strain of the case 2 can be detected, and also, the changes over time of the piezoelectric element 1 can be detected. Thus, for example, when the piezoelectric element 1 is not strained but only the case 2 is strained, when the case 2 is strained as a result of the piezoelectric element 1 being strained, or when one of the strain gauge 4 provided at the piezoelectric element 1 or the second strain gauge 5 provided at the case 2 is detached, strain of the case 2 can be immediately detected.

In particular, as an example of the case in which the piezoelectric element 2 is not strained but only the case 1 is strained, when a crack or breakage occurs in a part of the case 2 due to metal fatigue caused by stress concentration, by providing the second strain gauge 5 at the piezoelectric element 1 as well as providing the strain gauge 4 at the case 2, it is possible to detect an abnormality in the case 2 before the case 2 is cracked or damaged and to prevent the piezoelectric actuator 10 from being damaged.

It is possible for a person(s) skilled in the art to readily derive an additional effect(s) and/or variation(s). Hence, a broader aspect(s) of the present invention is/are not limited to a specific detail(s) and a representative embodiment(s) as illustrated and described above. Therefore, various modifications are possible without departing from the spirit or scope of a general inventive concept that is defined by the appended claim(s) and an equivalent(s) thereof.

REFERENCE SIGNS LIST

10 Piezoelectric actuator
1 Piezoelectric element
2 Case
21 Bottom portion
22 Tubular portion
221 Bent portion
23 Lid portion
31 Lead wire
32 Solder
33 Lead pin
34 Soft glass
4 Strain gauge
41 Lead wire
5 Second strain gauge

The invention claimed is:

1. A piezoelectric actuator comprising:
a piezoelectric element having a longitudinal direction;
a case configured to house the piezoelectric element inside, the case comprising
a lid portion,
a bottom portion, and
a tubular portion comprising a plurality of bent portions in the longitudinal direction, the plurality of bent portions each being configured to bend in response to extension and contraction of the piezoelectric element; and
a strain gauge positioned at the tubular portion at a bent portion of the plurality of bent portions.

2. The piezoelectric actuator according to claim 1, wherein
the strain gauge is positioned inside the case.

3. The piezoelectric actuator according to claim 1, wherein
the strain gauge is positioned outside the case.

4. The piezoelectric actuator according to claim 1, wherein
the tubular portion has a bellows shape.

5. The piezoelectric actuator according to claim 1, wherein
the tubular portion comprises protrusions, and
the strain gauge is positioned on at least one of the protrusions.

6. The piezoelectric actuator according to claim 1, wherein
the tubular portion comprises recesses, and
the strain gauge is positioned on at least one of the recesses.

7. The piezoelectric actuator according to claim 1, wherein
the tubular portion comprises protrusions and recesse, and
the strain gauge is positioned from at least one of the protrusions to at least one of the recesses.

8. The piezoelectric actuator according to claim 1, wherein
a plurality of the strain gauges are positioned at symmetrical positions with respect to the piezoelectric element.

9. The piezoelectric actuator according to claim 1, further comprising:
a second strain gauge, wherein
the second strain gauge is provided on a surface of the piezoelectric element.

* * * * *